United States Patent [19]

Ohta et al.

[11] Patent Number: 5,045,642

[45] Date of Patent: Sep. 3, 1991

[54] PRINTED WIRING BOARDS WITH SUPERPOSED COPPER FOILS CORES

[75] Inventors: Hideo Ohta, Nara; Kenji Miyamoto, Izumi, both of Japan; Wilson O. W. San, Singapore, Singapore; Alfred M. Martini, Redwood City, Calif.

[73] Assignees: Satosen, Co., Ltd., Osaka, Japan; Hewlett-Packard Company, Palo Alto, Calif.

[21] Appl. No.: 509,833

[22] Filed: Apr. 17, 1990

[30] Foreign Application Priority Data

Apr. 20, 1989 [JP] Japan .................................. 1-101474
Apr. 28, 1989 [JP] Japan .................................. 1-50376[U]

[51] Int. Cl.$^5$ .............................................. H05K 1/00
[52] U.S. Cl. .................................... 174/266; 174/255; 174/262; 361/414
[58] Field of Search .................... 174/255, 262, 266; 361/414

[56] References Cited

U.S. PATENT DOCUMENTS

| | | | |
|---|---|---|---|
| 3,243,498 | 3/1966 | Allen et al. | 174/266 |
| 3,739,469 | 6/1973 | Dougherty | 174/266 |
| 4,095,866 | 6/1978 | Merrill | 174/262 |
| 4,616,292 | 10/1986 | Sengoku et al. | 361/414 |
| 4,729,061 | 3/1988 | Brown | 361/414 |
| 4,854,038 | 8/1989 | Wiley | 174/255 |

Primary Examiner—Leo P. Picard
Assistant Examiner—Trinidad Korka
Attorney, Agent, or Firm—Armstrong, Nikaido, Marmelstein, Kubovcik & Murray

[57] ABSTRACT

The invention provides a printed wiring board having a plurality of copper foil cores superposed over one another and spaced away from one another. The portions of the cores are exposed at the end surfaces of the board. A plurality of holes extend vertically through the copper foil cores and have hole-defining internal surfaces so plated as to connect the cores to one another. Another printed wiring board has a plurality of copper foil cores superposed over one another and spaced away from one another. The end portions of the cores are exposed at the end surfaces of the board. A plurality of holes extend vertically through the copper foil cores and have hole-defining internal surfaces so plated as to connect the cores to one another. The underside of the copper foil core at the lowermost position is exposed at a recess formed on the rear side of the board. Plating is formed which extends from the lowermost copper foil core to the rear side of the board.

4 Claims, 4 Drawing Sheets

PRINTED WIRING BOARDS WITH SUPERPOSED COPPER FOILS CORES

BACKGROUND OF THE INVENTION

1. Field of the Invention

The present invention relates to printed wiring boards of the metal core type.

A typical feature of the metal-core type printed wiring boards is its heat dissipation capacity.

2. Description of the Prior Art

Heretofore attempts have been made to improve the heat dissipation capacity of printed wiring boards by use of aluminum foil cores. However, aluminum foil cores are still unsatisfactory in the heat dissipation capacity as required in use of a package with a component such as an integrated circuit (IC) mounted thereon and involving the evolution of heat in large amount.

SUMMARY OF THE INVENTION

An object of the present invention is to provide a printed wiring board of the metal core type having a high heat dissipation capacity.

To achieve this and other objects, the present invention provides a printed wiring board comprising a plurality of copper foil cores superposed over one another and spaced away from one another, the end portions of the cores being exposed at the end surfaces of the board; and a plurality of holes extending vertically through the copper foil cores and having hole-defining internal surfaces so plated as to connect the cores to one another.

According to the present invention, there is also provided a printed wiring board comprising a plurality of copper foil cores superposed over one another and spaced away from one another, the end portions of the cores being exposed at the end surfaces of the board; and a plurality of holes extending vertically through the copper foil cores and having hole-defining internal surfaces so plated as to connect the cores to one another, the underside of the copper foil core at the lowermost position being exposed at a recess formed on the rear side of the board, plating being formed which extends from the underside of the lowermost copper foil core to the rear side of the board.

While the type of the foregoing holes is not critical in the invention, blind holes are preferred because the blind holes can be formed at any desired locations without limitation by a wiring pattern.

The heat evolved from an integrated circuit or like component mounted on the printed wiring board of the invention is transmitted through the copper foil cores and is dissipated away from the end portions of copper foil cores which are exposed at the end surfaces of the board.

In accordance with the invention, the heat which is transmitted through the superposed copper foil cores can be dissipated away with a high efficiency. Further advantageously the cores in the printed wiring boards of the invention are made of copper higher in heat conductivity than aluminum, and the superposed copper foil cores are joined to one another by the plating so that the heat is spread through the copper foil cores at a high rate. With this structure, the printed wiring boards of the invention have a high heat dissipation capacity sufficient to fulfill the requirement for the order of heat dissipation capacity in use of a package with a component mounted thereon and prone to evolve a large amount of heat.

According to another aspect of the invention, the underside of the lowest copper foil core is exposed at a recess formed on the underside of the board, and a portion of the plating connected to the lowest copper foil core is exposed on the underside of the board, so that the heat can be released from the exposed underside of the lowest copper foil core and from the exposed plating portion on the underside thereof, resulting in heat dissipation at a higher rate.

According to the above mentioned aspects of the present invention, there are provided printed wiring boards of the metal core type having a high heat dissipation capacity. Moreover such preferred printed wiring boards can be produced by a simple procedure.

BRIEF DESCRIPTION OF THE INVENTION

The present invention will be described below in greater detail with reference to the accompanying drawings in which.

DETAILED DESCRIPTION OF THE PREFERRED EMBODIMENTS

Figure 1:
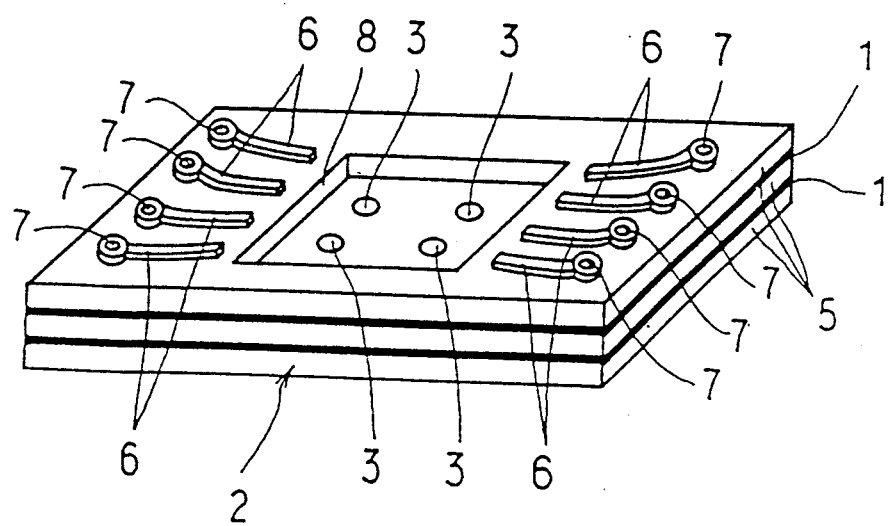
FIG. 1 is a perspective view showing an embodiment of the printed wiring boards according to the present invention.

Like reference numerals designate like members throughout the drawings.

Figure 2:
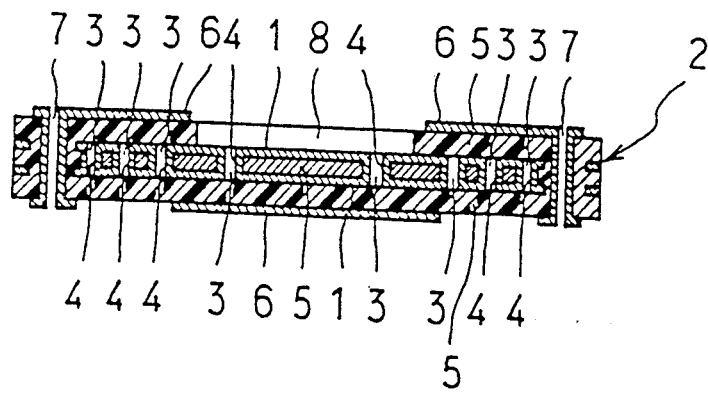
FIG. 2 is a sectional view of the embodiment of FIG. 1.

Referring to FIGS. 1 and 2, a printed wiring board 2 has a plurality of copper foil cores 1 superposed over one another as in conventional printed wiring boards. The end portions of the copper foil cores 1 are laid bare at the end surfaces of the board 2 on the four sides thereof. Holes 3, preferably blind holes, bored at various locations in the board 2 and having hole-defining internal surfaces 4 of plating covered with metal extend vertically through the superposed copper foil cores 1, whereby the copper foil cores 1 are joined to one another. Also disclosed in the drawings are resin layers 5 wire elements 6 in the pattern; and through holes 7. The through holes 7 are insulated from the copper foil cores 1. A component such as an integrated circuit is mounted on a recess 8 formed on the top surface of the board. The upper surface of the upper copper foil core 1 is exposed at the recess 8.

The heat emitted from an integrated circuit or like component (not shown) on the recess 8 is transmitted to an upper copper foil core 1. The heat transferred to the upper copper foil core 1 is released from the end portions of the upper copper foil core 1 which are exposed at the end surfaces of the board on the four sides thereof. The heat is transferred from the upper copper foil core 1 to a lower copper foil core 1 through the plating 4 on the internal surfaces of the holes 3 and is dissipated away from the end portions of the lower copper foil core 1 which are exposed at the end surfaces of the board on the four side thereof.

Figure 3:
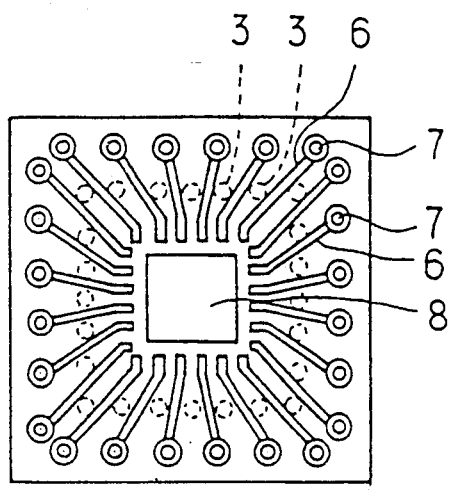
FIG. 3 is a plan view showing another embodiment of the printed wiring boards according to the invention.
Figure 4:
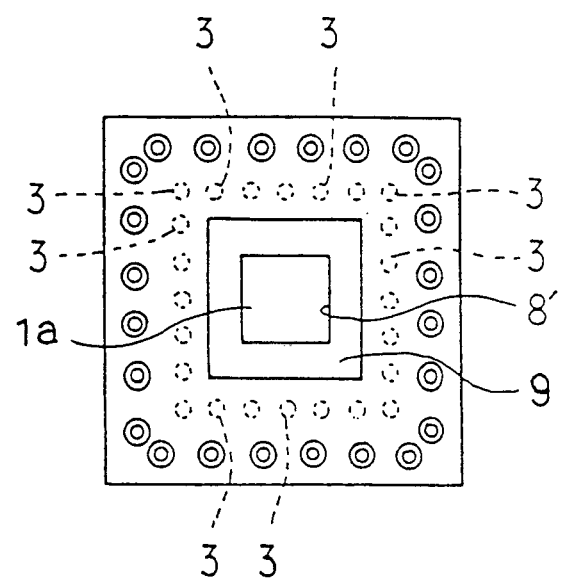
FIG. 4 is a rear side view of the embodiment of FIG. 3.
Figure 5:
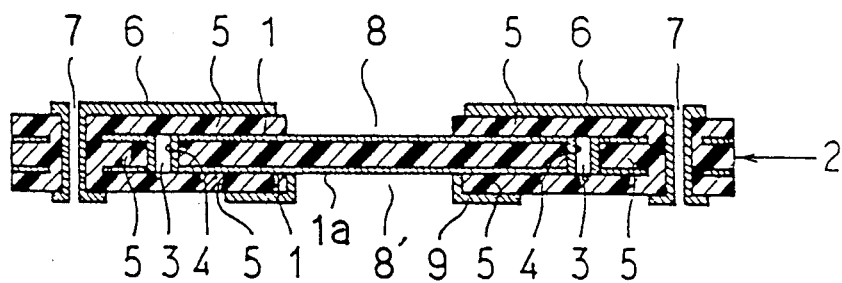
FIG. 5 is a sectional view of the embodiment of FIGS. 3 and 4.

FIGS. 3 to 5 show another embodiment of the printed wiring boards according to the invention which is different from the embodiment of FIGS. 1 and 2. The embodiment of FIGS. 3 to 5 includes a recess 8' formed on the underside of the board, a portion la of the lowest copper foil core 1 which portion is exposed at the recess 8', and plating 9 formed which extends from the underside of the lowest copper foil core 1 to the rear side of the board.

In the embodiment of FIG. 3 to 5, the heat discharged from an integrated circuit or like component is released from the end portions of an upper copper foil core 1 and the end portions of a lower copper foil core 1 all exposed at the end surfaces of the board on the four sides thereof, and from the exposed portion la of the lowest copper foil core 1 and the exposed plating 9.

Figure 6:
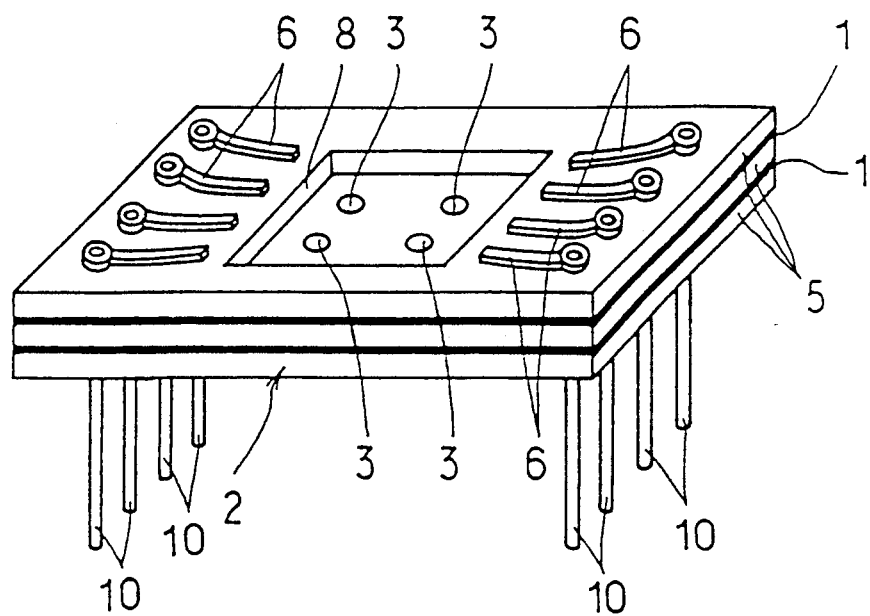
FIG. 6 is a perspective view showing a further embodiment of the printed wiring boards according to the invention.
Figure 7:
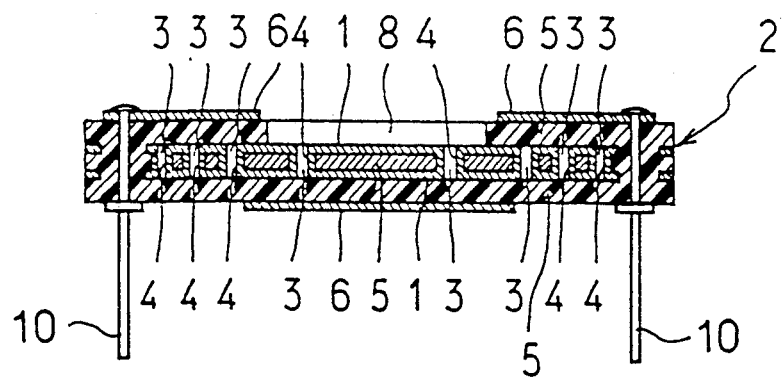
FIG. 7 is a sectional view of the embodiment of FIG. 6.

FIGS. 6 and 7 show a further embodiment of the printed wiring boards according to the invention. The embodiment of FIGS. 6 and 7 is substantially identical in structure with the embodiment of FIGS. 1 and 2 except that the wire elements 6 in the embodiment of FIGS. 6 and 7 are electrically connected not by means of plated-through holes but by means of pins 10 provided as terminals, namely except that the embodiment of FIGS. 6 and 7 is a pin-grid array type printed wiring board. Therefore the embodiment of FIGS. 6 and 7 can release the heat at a rate as high as the embodiment of FIGS. 1 and 2.

Figure 8:
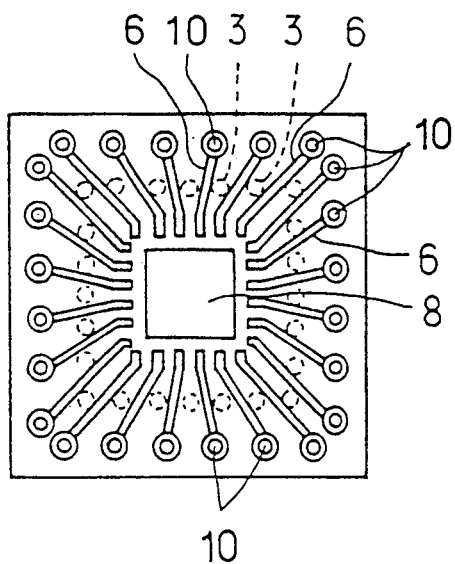
FIG. 8 is a plan view showing a modification of the embodiment of FIGS. 5 and 6.
Figure 9:
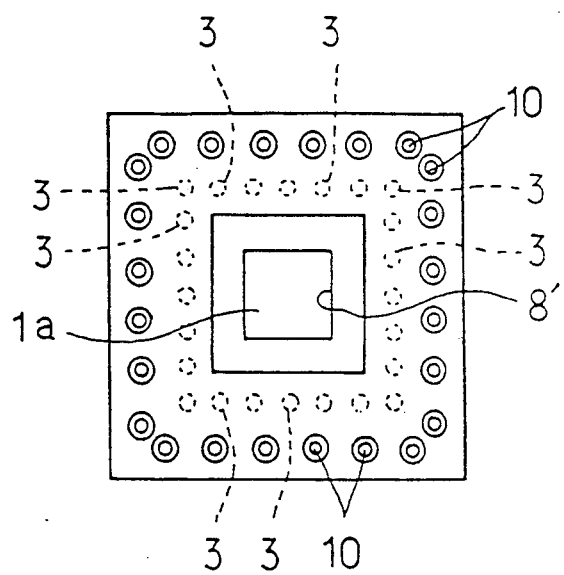
FIG. 9 is a rear side view of the modification of FIG. 8.
Figure 10:
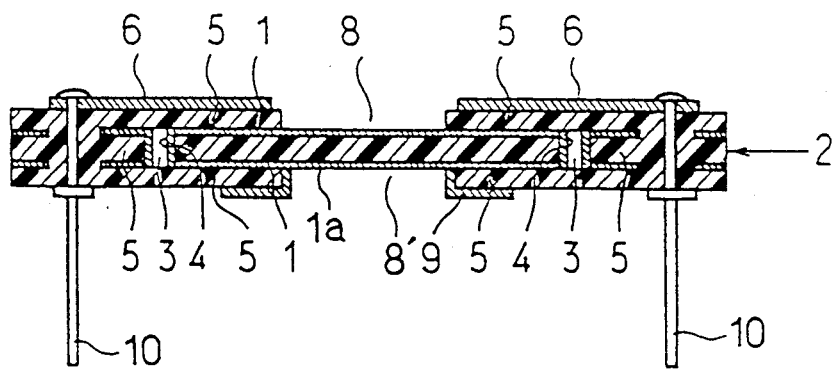
FIG. 10 is a sectional view of the modification of FIG. 8.

FIGS. 8 to 10 show a modification of the pin-grid array type printed wiring board. The modification is virtually identical in structure with the embodiment of FIGS. 3 to 5 except that the modification is of the pin-grid array type. Consequently the modification of FIGS. 8 to 10 is almost equal in heat dissipation capacity to the embodiment of FIGS. 3 to 5.

We claim:

1. A printed wiring board comprising:
    a plurality of resin layers;
    a plurality of copper foil cores superposed over one another and spaced away from one another by said resin layers, end portions of each of the copper foil cores exposed at end surfaces thereof for dissipating heat;
    a plurality of holes extending vertically through the plurality of copper foil cores and some of the resin layers and having hole-defining internal surfaces so plated as to connect the plurality of copper foil cores to one another; and
    wiring elements formed on top and bottom resin layers.

2. A printed wiring board according to claim 1 wherein the plurality of holes are of a blind type.

3. A printed wiring board comprising:
    a plurality of resin layers;
    a plurality of copper foil cores superposed over one another and spaced away from one another by said resin layers, end portions of each of the copper foil cores exposed at end surfaces thereof for dissipating heat;
    a plurality of holes extending vertically through the plurality of copper foil cores and some of the resin layers and having hole-defining internal surfaces so plated as to connect the plurality of copper foil cores to one another, an underside of the copper foil core at a lowermost position exposed at a recess formed on a rear side of a lowermost resin layer;
    plating formed which extends from the lowermost copper foil core to the rear side of the lowermost resin layer; and
    wiring elements formed on a top resin layer.

4. A printed wiring board according to claim 3 wherein the plurality of holes are of a blind type.

* * * * *